BISTABLE CIRCUITS

Filed March 1, 1960 2 Sheets-Sheet 1

INVENTOR
JOSEPH E. MONAHAN

BY F. J. Sullivan

ATTORNEY

July 6, 1965 J. E. MONAHAN 3,193,695

BISTABLE CIRCUITS

Filed March 1, 1960 2 Sheets-Sheet 2

INVENTOR
JOSEPH E. MONAHAN

BY F. J. Sullivan

ATTORNEY

United States Patent Office 3,193,695
Patented July 6, 1965

3,193,695

BISTABLE CIRCUITS

Joseph E. Monahan, Framingham, Mass., assignor to Sylvania Electric Products Inc., a corporation of Delaware Filed Mar. 1, 1960, Ser. No. 12,009
3 Claims. (Cl. 307—88.5)

Figure 1:
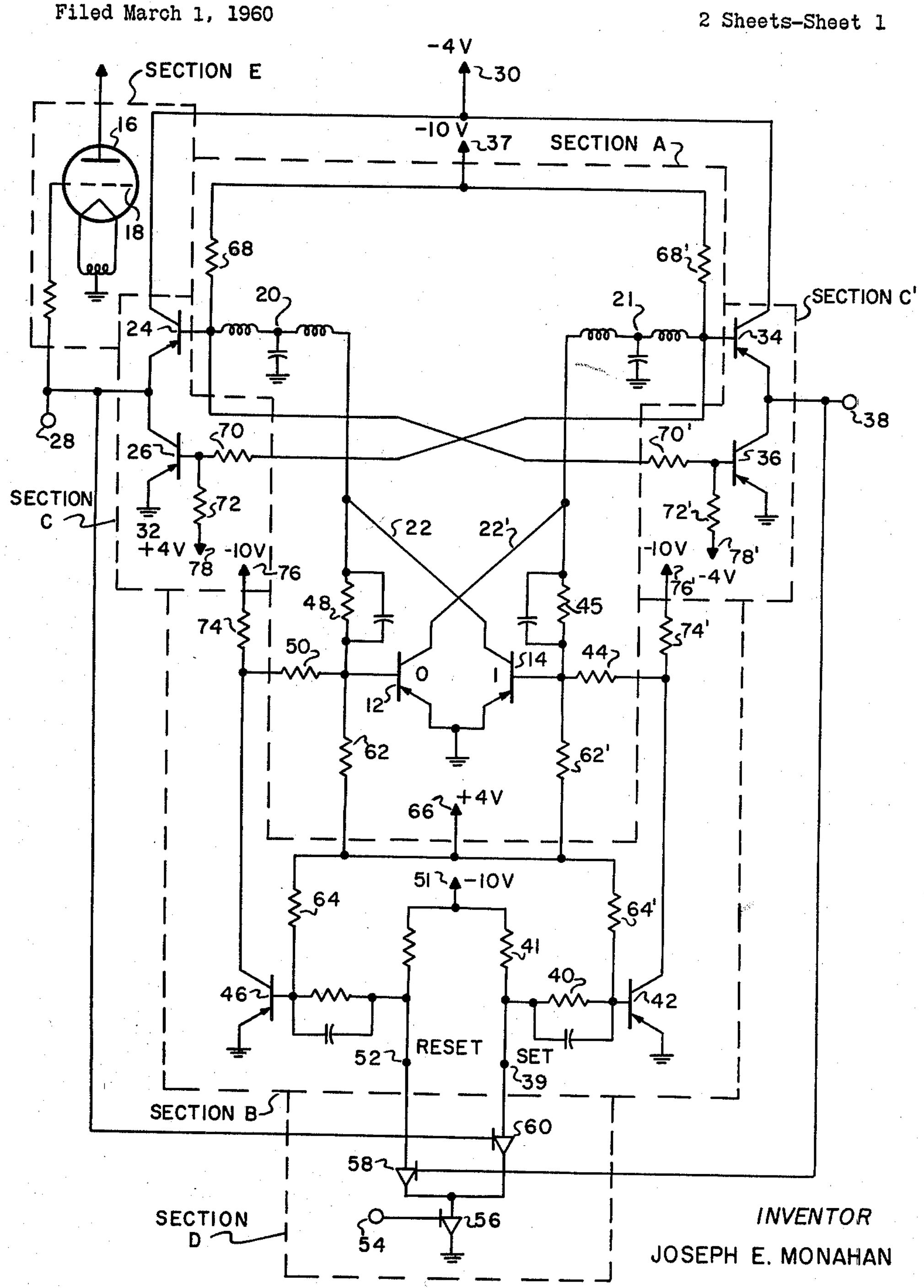

This invention is concerned with electronic data processing systems and particularly with bistable circuits useful in such equipment.

A basic component of computers and other electronic data processing equipment is the so-called flip-flop or bistable circuit which stores, processes, or indicates by means of one or the other of its two "electrical conditions" a ZERO or ONE in the binary language of the equipment in which it is employed.

Flip-flop circuits in general follow the standard Eccles-Jordan configuration in that they comprise a left and a right hand electronic switch (vacuum tube or transistor) with appropriate feed-back connection between them so that when one is conducting it holds the other in non-conducting condition and vice-versa. The respective sides of this circuit arrangement are arbitrarily designated as ONE or ZERO and the flip-flop is said to be in ONE or ZERO condition depending upon which side is conducting.

The demand for faster and more complex systems has required that these flip-flops operate with extreme reliability at microsecond frequencies and yet drive considerable loads. One technique which has been adopted to provide this capability has been the use of what are termed "cascode amplifiers" to buffer the output of the basic flip-flop. These cascodes in a typical transistorized configuration comprise a pair of transistors serially connected, collector of one to the emitter of the other, between a source of ZERO-representing and a source of ONE-representing potentials and with an output at the junction of the transistors so that one acts as an inverter and the other as an emitter follower. Each side of the flip-flop is connected to a different cascode with a direct connection to the base of one transistor and indirect connection through an inverter stage to the base of the other transistor. Thus, the highly sensitive flip-flop itself is isolated from transients in the load and the cascode serves as the main output switch in a push-pull drive arrangement utilizing the fast fall time of its emitter follower and the fast rise time of its inverter to provide sharp transition from one output level to another.

This arrangement has proved quite satisfactory but it is subject to heat and power dissipation difficulties, transistor burn-out, etc. if both transistors in the cascode become simultaneously conductive and provide an effective short circuit between the ZERO and ONE power buses. Moreover, the additional inverter stages between the flip-flop and the cascodes increase the transistor count and introduce additional circuit delays, design problems, etc.

Accordingly, the primary object of the present invention is to provide improved bistable circuitry for computers and other electronic data processing equipment. Another object is to provide an improved flip-flop of the cascode output type. Other objects are to provide improved triggering and internal delay techniques for flip-flop circuits.

These and related objects have been accomplished in one embodiment of the invention by omitting the inverter stage between the flip-flop and its cascode output. This is made possible by connecting one of the two cascode transistors to one side of the flip-flop and the other transistor to the other side and providing a unique triggering arrangement whereby in a "set" or "reset" operation the non-conducting side is rendered conductive before the conducting side is cut off thereby insuring that all the conducting transistors in the cascode output will be cut off before the non-conducting transistors become conductive. This eliminates the possibility of both transistors in the cascode being simultaneously conductive with the consequent dangers previously mentioned.

Figure 2:
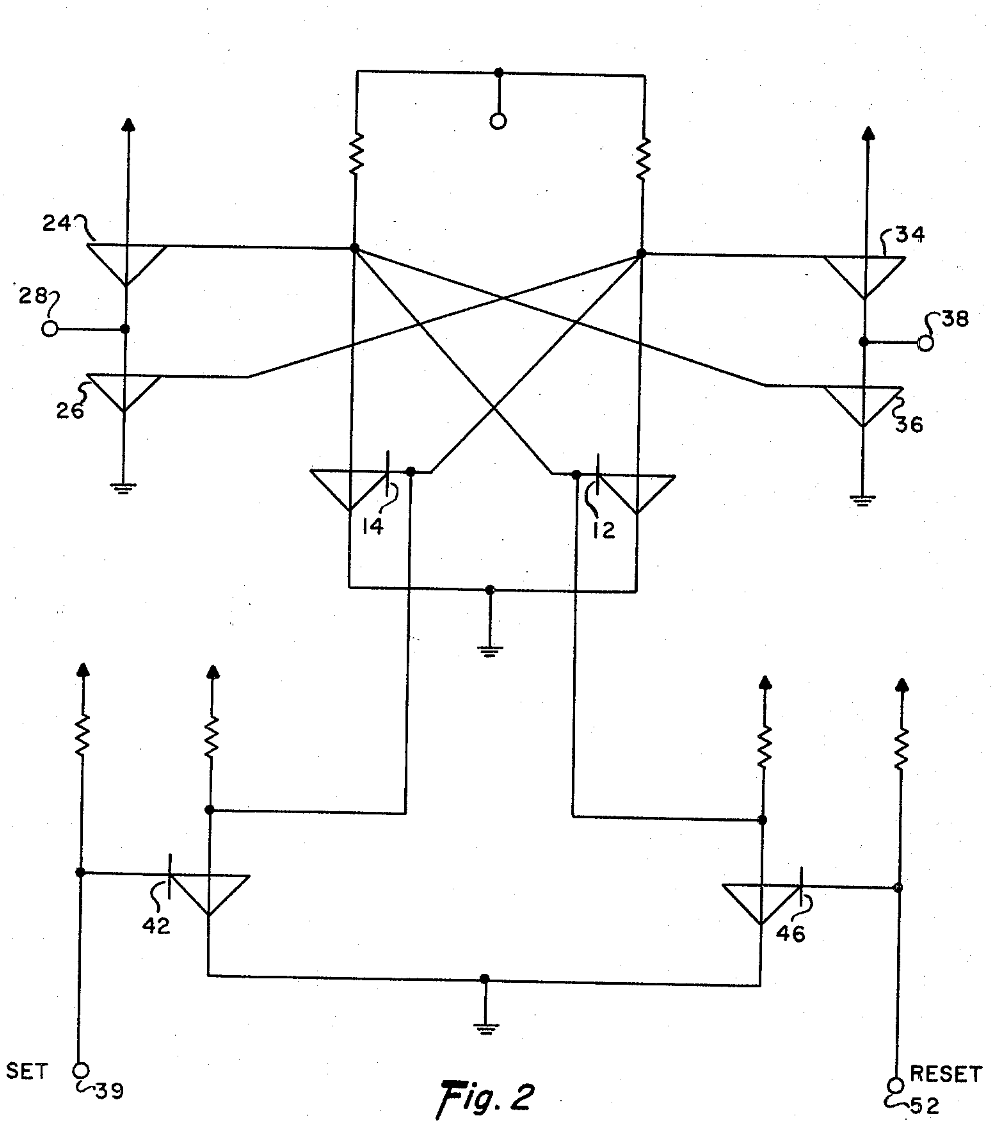

Other objects, features, and embodiments of the invention will be apparent from the following description and reference to the accompanying drawings, wherein:

FIG. 1 is a schematic representation of a cascode output flip-flop circuit embodying the invention; and, FIG. 2 is a schematic representation in simplified form of the circuit of FIG. 1.

In FIG. 1, the entire flip-flop circuit has been logically divided into five sections. The first of these, labeled Section A, is an Eccles-Jordan basic flip-flop. It can best be understood if thought of as two transistors inverter circuits connected in such a manner that the output of one feeds the input of the other, so that when one transistor 12 is in saturation, the other transistor 14 will be held "OFF." Section B comprises the input trigger buffer circuit and shows inverter amplifiers which prevent input noise from reaching the basic flip-flop. Section C and Section C′ are output buffers, i.e. the cascode amplifiers. These provide sufficient power to drive the load at high switching speeds and provide isolation for the basic flip-flop from noise due to load changes. Section D is a steering gate for the complementing input, and Section E is an indicator circuit containing a fluorescent tube 16 which lights with ground potential and extinguishes with −4 volts applied to its control grid 18.

For the purpose of this description we will assume that a binary ONE is represented by a −4 volt signal level, a binary ZERO by ground potential, and the indicator lamp 16 is illuminated (in a manner which will be explained later in more detail) when the flip-flop is in "set" condition, i.e. when transistor 14 is conducting and transistor 12 is cut off. Consequently, the left and right sides of the flip-flop may be referred to as ZERO and ONE, respectively, because when the right hand side (transistor 14) is conducting the lamp 16 is illuminated to indicate the flip-flop is in ONE condition and when the left hand side (transistor 12) is conducting the lamp is extinguished to indicate ZERO condition. These assumptions may be summarized by saying that the flip-flop is "set" to ONE condition and "reset" to ZERO condition.

Delays 20, 21 have been incorporated into the circuit to assure that the output does not change sooner than a suitable period (e.g. 160 millimicroseconds) after the trigger pulse to prevent it from changing state too rapidly. This delay is in the form of an L-C network placed between the collector leads 22, 22′ of the basic flip-flop and the output cascode buffers Sections C and C′. The cascode circuit of Section C includes an emitter follower 24 and an inverter 26 driving a common output 28. As explained previously, this combination utilizes the fast fall time of the emitter follower 24 and the fast rise time of the inverter 26 to charge and discharge a highly capacitive load at millimisceonds rates. It is important that only one of the two transistors 24, 26 in the cascode circuit be conducting at one time. If both conduct simultaneously, the two transistors act as a short circuit from power supply 30 to ground potential at terminal 32 and are subject to destruction by excessive power dissipation. Even if both transistors are not simultaneously "ON" for any considerable length of time at high repetition frequency the resulting high operating temperatures could be damaging. To avoid having the transistors 24, and 26 of cascode C and equivalent transistors 34 and 36 of cascode C′ simultaneously conductive the circuit embodying the invention has been so arranged that the conductive transistor in each cascode is cut off before the other transistor is permitted to conduct. This will be apparent in the following more detailed explanation of the operation of the circuit.

Assume that the flip-flop initially is in ZERO condition with transistor 12 "ON" and transistor 14 "OFF." Because transistor 14 is "OFF," its collector potential, derived from terminal 37, is applied to the base of transistor 24 causing it to conduct and bringing the cascode output 28 to approximately the same voltage as power supply 30, i.e. 4 volts negative. This negative signal applied to the control grid 18 of lamp 16 holds the lamp extinguished to indicate that the circuit is in ZERO condition. The same potential is applied by cross connection to the base of transistor 36 in the other cascode aplifier C′ causing it to conduct and apply ground potential to its output terminal 38. Because transistor 12 is conducting it applies ground potential to the base of transistors 34 and 26 and holds them "OFF."

To change state a ground level pulse, e.g. of 100 millimicroseconds duration, is applied at the "set" input 39 which is at the junction of resistors 40 and 41. This pulse turns normally conducting transistor 42 "OFF," causing its collector to go negative. Application of this negative potential to the base of transistor 14 through resistor 44 switches transistor 14 from "OFF" to "ON" condition. This applies ground potential to the base of transistors 24 and 36 and cause them to cut "OFF." The ground potential at the collector of transistor 14 is also applied to the base of transistor 12 through resistor 48 which also has ground potential applied to it through resistor 50 since transistor 46 is also conducting. As transistor 12 goes "OFF" its collector goes to a negative voltage greater than power supply 30, viz. the negative 10 volts applied to terminal 37, which when transmitted through delay line 21 turns transistor 34 "ON" and also maintains a potential of −10 volts at the base of transistor 14 through resistor 45. Resistor 45 is in "resistor OR relationship" with resistor 44, in the sense that current through resistor 45 or resistor 44 will cause transistor 14 to conduct, in order to increase the width of the pulse input to the base of transistor 14. Since transistor 26 is coupled to transistor 34 it also goes "ON." Thus, there is a delay between turning one transistor "OFF" and the other "ON" in each of the cascode amplifiers. This safety feature will be more apparent from the following summarized description, referring to the simplified diagram of FIG. 2.

With the basic flip-flop in the "ONE" or "set" condition transistor 14, 26, and 34 are "ON" while transistors 12, 24, and 36 are "OFF." Transistors 42 and 46 are "ON" at all times except during a trigger pulse due to negative bias derived from terminal 51. The circuit is so designed that the "turn-on" and "turn-off" times of the various transistors are equal for all practical purposes, and for the purpose of this explanation we may assume that a given time unit is allowed for a transistor to change state. The time sequence of transition from one condition to another is then as follows: When a ground potential trigger pulse is applied to the reset input 52, initially, transistors 34 and 26 are "ON" and 24 and 36 are "OFF." This applies a negative potential to terminal 38 and ground potential to terminal 28. At the end of the first time unit transistor 46 switches "OFF." Then, after the second time unit, transistor 12 switches "ON." After the third time unit transistor 14, 34, and 26 go "OFF"; and, at the end of the fourth time unit, transistors 24 and 36 go "ON." It is obvious that after the third time unit, all transistors in both cascode output circuits are "OFF" at the same time. Also transistors 34 and 36 or 24 and 26, respectively, in the same cascode are never both "ON" simultaneously. This operating sequence eliminates current surge and heat and power dissipation problems. Moreover, this trigger sequence provides an increase of circuit delay over methods in general use equal to one time unit, e.g. 30 millimicroseconds, which helps to eliminate any spurious trigger problems that may exist.

The flip-flop may be complemented by applying a negative trigger pulse via terminal 54 in Section D to transistor 56 which is connected in separate Boolean AND relationship to transistors 58 and 60 in the "set" and "reset" circuits, respectively. Transistors 58 and 60 perform a gating function in conjunction with the trigger pulse and will either "set" or "reset" the flip-flop depending upon which transistor has been rendered conductive by a negative signal from its associated output terminal 28 or 38.

Resistors 62, 62′ and 64, 64′ apply a bias potential from terminal 66 to transistors 12, 14, 46 and 42 respectively. Resistors 68, 68′, 70, 70′, 72, 72′, 74, 74′ all perform similar biasing functions.

Recommended identification and values for components of the circuit described are as follows:

| | |
|---|---|
| Lamp 16 | Amperex 6977. |
| Delay 20, 21 | L 15 μh., C 100 μμf. |
| Transistors | 2N393. |
| Potential at terminal 30 | −4 volts. |
| Resistors 40, 48 and 74 | 1.2K. |
| Resistors 44 and 50 | 1K. |
| Resistors 62, 64 and 72 | 10K. |
| Resistor 68 | 560 Ω. |
| Resistor 70 | 2.2K. |
| Potential at terminals 37, 51 and 76 | −10 volts. |
| Potential at terminals 66 and 78 | +4 volts. |

A specific embodiment of the invention has been described, and specific approximate values have been disclosed for various elements. These are suggested for operation in the illustrative example and for the purpose described, and are not to be taken as limitations on the invention itself which is to be accorded the scope of the appended claims.

What is claimed is:

1. A bistable circuit having: first and second transistors cross connected in flip-flop relationship; first and second sources of reference potential; first and second current polarized switching devices; first and second output terminals; each of said switching devices including a first switch connected between one of said terminals and said first source of reference potential and a second switch connected between said same terminal and said second source of reference potential, said first switch and said second switch in each of said switching devices and said first and second transistors all being of the same polarity; means operable by said first transistor for controlling said first switch in said first switching device and said second switch in said second switching device; and, means operable by said second transistor for controlling the second switch of said first switching device and said first switch in said second switching device.

2. A bistable circuit comprising first and second transistors each having collector, emitter and base electrodes; means cross connecting the base of each of said transistors to the collector of the other; a source of first reference potential; a source of second reference potential; first and second cascodes separately connected between said sources of potential; each of said first and second cascodes including an emitter follower and an inveter transistor, the emitter follower and the inverter each having collector, emitter and base electrodes; the collector of the inverter being connected to the emitter of the emitter follower in each of said cascodes; the collector of said first transistor being connected to the base of the emitter follower in said second cascode and the base of the inverter in said first cascode; the collector of said second transistor being connected to the base of the emitter follower in said first cascode and the base of the inverter in said second cascode; said first reference potential being connected to the collector of the emitter follower transistor in each of said first and second cascodes, respectively, and, said second source of reference potential being connected to the emitter of the inverter transistor in each of said first and second cascodes, respectively, and to the emitter of each of said first and second transistors, respectively.

3. The invention according to claim 2 wherein a signal delay device is provided in the connection between the collector of each of said first and second transistors and the cascode opposite physically to that transistor.

References Cited by the Examiner

UNITED STATES PATENTS

| | | | |
|---|---|---|---|
| 2,212,967 | 8/40 | White | 328—196 |
| 2,888,579 | 5/59 | Wanlass | 307—88.5 |
| 2,920,196 | 1/60 | O'Brien | 328—197 |
| 2,945,965 | 7/60 | Clark | 307—88.5 |
| 3,048,709 | 8/62 | Preston | 307—88.5 |
| 3,088,041 | 4/63 | Hinkein et al. | 307—88.5 |

OTHER REFERENCES

Faster Than Thought, by Bowden, 1953, page 51.

Arithmetic Operations in Digital Computers, by Richards, 1955, TK 788 R5C.4, page 47.

Static Switching Devices, by Mathias, Control Engineering, May 1957, pages 82, 83 and 84.

JOHN W. HUCKERT, *Primary Examiner.*

GEORGE N. WESTBY, HERMAN K. SAALBACH, *Examiners.*